(12) United States Patent
Hou et al.

(10) Patent No.: US 7,808,051 B2
(45) Date of Patent: Oct. 5, 2010

(54) STANDARD CELL WITHOUT OD SPACE EFFECT IN Y-DIRECTION

(75) Inventors: Yung-Chin Hou, Taipei (TW); Lee-Chung Lu, Taipei (TW); Ta-Pen Guo, Cupertino, CA (US); Li-Chun Tien, Tainan (TW); Ping Chung Li, Hsin-Chu (TW); Chun-Hui Tai, Hsin-Chu (TW); Shu-Min Chen, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 95 days.

(21) Appl. No.: 12/345,372

(22) Filed: Dec. 29, 2008

(65) Prior Publication Data

US 2010/0078725 A1 Apr. 1, 2010

Related U.S. Application Data

(60) Provisional application No. 61/101,002, filed on Sep. 29, 2008.

(51) Int. Cl.
*H01L 29/76* (2006.01)

(52) U.S. Cl. .......... 257/368; 257/E27.06; 257/E27.108; 257/E29.02

(58) Field of Classification Search ............... 257/69, 257/204, 206, 296, 368, E27.06, E27.108, 257/E29.02
See application file for complete search history.

(56) References Cited

U.S. PATENT DOCUMENTS

| | | | |
|---|---|---|---|
| 4,069,094 A | 1/1978 | Shaw et al. |
| 4,314,269 A | 2/1982 | Fujiki |
| 4,497,683 A | 2/1985 | Celler et al. |
| 4,631,803 A | 12/1986 | Hunter et al. |

(Continued)

FOREIGN PATENT DOCUMENTS

EP 0 683 522 A2 11/1995

(Continued)

OTHER PUBLICATIONS

"Future Gate Stack," SEMATECH Inc., 2001 Annual Report, 2 pages.

(Continued)

*Primary Examiner*—Quoc D Hoang
(74) *Attorney, Agent, or Firm*—Slater & Matsil, L.L.P.

(57) ABSTRACT

An integrated circuit structure includes a semiconductor substrate; a first active region in the semiconductor substrate; and a second active region in the semiconductor substrate and of an opposite conductivity type than the first active region. A gate electrode strip is over the first and the second active regions and forms a first MOS device and a second MOS device with the first active region and the second active region, respectively. A first spacer bar is in the semiconductor substrate and connected to the first active region. At least a portion of the first spacer bar is adjacent to and spaced apart from a portion of the first active region. A second spacer bar is in the semiconductor substrate and connected to the second active region. At least a portion of the second spacer bar is adjacent to and spaced apart from a portion of the second active region.

21 Claims, 11 Drawing Sheets

U.S. PATENT DOCUMENTS

| | | |
|---|---|---|
| 4,892,614 A | 1/1990 | Chapman et al. |
| 4,946,799 A | 8/1990 | Blake et al. |
| 4,952,993 A | 8/1990 | Okumura |
| 5,130,773 A | 7/1992 | Tsukada |
| 5,155,571 A | 10/1992 | Wang et al. |
| 5,273,915 A | 12/1993 | Hwang et al. |
| 5,338,960 A | 8/1994 | Beasom |
| 5,378,919 A | 1/1995 | Ochiai |
| 5,447,884 A | 9/1995 | Fahey et al. |
| 5,461,250 A | 10/1995 | Burghartz et al. |
| 5,479,033 A | 12/1995 | Baca et al. |
| 5,525,828 A | 6/1996 | Bassous et al. |
| 5,534,713 A | 7/1996 | Ismail et al. |
| 5,596,529 A | 1/1997 | Noda et al. |
| 5,629,544 A | 5/1997 | Voldman et al. |
| 5,656,524 A | 8/1997 | Eklund et al. |
| 5,708,288 A | 1/1998 | Quigley et al. |
| 5,714,777 A | 2/1998 | Ismail et al. |
| 5,763,315 A | 6/1998 | Benedict et al. |
| 5,783,850 A | 7/1998 | Liau et al. |
| 5,789,807 A | 8/1998 | Correale, Jr. |
| 5,811,857 A | 9/1998 | Assaderaghi et al. |
| 5,936,276 A * | 8/1999 | Maurelli et al. ............. 257/318 |
| 5,955,766 A | 9/1999 | Ibi et al. |
| 5,965,917 A | 10/1999 | Maszara et al. |
| 5,972,722 A | 10/1999 | Visokay et al. |
| 6,008,095 A | 12/1999 | Gardner et al. |
| 6,015,993 A | 1/2000 | Voldman et al. |
| 6,027,988 A | 2/2000 | Cheung et al. |
| 6,046,487 A | 4/2000 | Benedict et al. |
| 6,059,895 A | 5/2000 | Chu et al. |
| 6,096,591 A | 8/2000 | Gardner et al. |
| 6,100,153 A | 8/2000 | Nowak et al. |
| 6,100,204 A | 8/2000 | Gardner et al. |
| 6,103,599 A | 8/2000 | Henley et al. |
| 6,107,125 A | 8/2000 | Jaso et al. |
| 6,111,267 A | 8/2000 | Fischer et al. |
| 6,190,996 B1 | 2/2001 | Mouli et al. |
| 6,222,234 B1 | 4/2001 | Imai |
| 6,232,163 B1 | 5/2001 | Voldman et al. |
| 6,256,239 B1 | 7/2001 | Akita et al. |
| 6,258,664 B1 | 7/2001 | Reinberg |
| 6,281,059 B1 | 8/2001 | Cheng et al. |
| 6,291,321 B1 | 9/2001 | Fitzgerald |
| 6,294,834 B1 | 9/2001 | Yeh et al. |
| 6,303,479 B1 | 10/2001 | Snyder |
| 6,339,232 B1 | 1/2002 | Takagi |
| 6,358,791 B1 | 3/2002 | Hsu et al. |
| 6,387,739 B1 | 5/2002 | Smith, III |
| 6,396,137 B1 | 5/2002 | Klughart |
| 6,396,506 B1 | 5/2002 | Hoshino et al. |
| 6,407,406 B1 | 6/2002 | Tezuka |
| 6,413,802 B1 | 7/2002 | Hu et al. |
| 6,414,355 B1 | 7/2002 | An et al. |
| 6,420,218 B1 | 7/2002 | Yu |
| 6,420,264 B1 | 7/2002 | Talwar et al. |
| 6,429,061 B1 | 8/2002 | Rim |
| 6,433,382 B1 | 8/2002 | Orlowski et al. |
| 6,448,114 B1 | 9/2002 | An et al. |
| 6,448,613 B1 | 9/2002 | Yu |
| 6,475,838 B1 | 11/2002 | Bryant et al. |
| 6,475,869 B1 | 11/2002 | Yu |
| 6,489,215 B2 | 12/2002 | Mouli et al. |
| 6,489,664 B2 | 12/2002 | Re et al. |
| 6,489,684 B1 | 12/2002 | Chen et al. |
| 6,495,900 B1 | 12/2002 | Mouli et al. |
| 6,498,359 B2 | 12/2002 | Schmidt et al. |
| 6,518,610 B2 | 2/2003 | Yang et al. |
| 6,521,952 B1 | 2/2003 | Ker et al. |
| 6,524,905 B2 | 2/2003 | Yamamichi et al. |
| 6,525,403 B2 | 2/2003 | Inaba et al. |
| 6,541,343 B1 | 4/2003 | Murthy et al. |
| 6,555,839 B2 | 4/2003 | Fitzgerald |
| 6,558,998 B2 | 5/2003 | Belleville et al. |
| 6,573,172 B1 | 6/2003 | En et al. |
| 6,576,526 B2 | 6/2003 | Kai et al. |
| 6,586,311 B2 | 7/2003 | Wu |
| 6,600,170 B1 | 7/2003 | Xiang |
| 6,617,643 B1 | 9/2003 | Goodwin-Johansson |
| 6,621,131 B2 | 9/2003 | Murthy et al. |
| 6,633,070 B2 | 10/2003 | Miura et al. |
| 6,646,322 B2 | 11/2003 | Fitzgerald |
| 6,653,700 B2 | 11/2003 | Chau et al. |
| 6,657,259 B2 | 12/2003 | Fried et al. |
| 6,657,276 B1 | 12/2003 | Karlsson et al. |
| 6,674,100 B2 | 1/2004 | Kubo et al. |
| 6,686,247 B1 | 2/2004 | Bohr |
| 6,690,082 B2 | 2/2004 | Lakshmikumar |
| 6,720,619 B1 | 4/2004 | Chen et al. |
| 6,724,019 B2 | 4/2004 | Oda et al. |
| 6,734,527 B1 | 5/2004 | Xiang |
| 6,737,710 B2 | 5/2004 | Cheng et al. |
| 6,740,535 B2 | 5/2004 | Singh et al. |
| 6,759,717 B2 | 7/2004 | Sagarwala et al. |
| 6,762,448 B1 | 7/2004 | Lin et al. |
| 6,784,101 B1 | 8/2004 | Yu et al. |
| 6,794,764 B1 | 9/2004 | Kamal et al. |
| 6,797,556 B2 | 9/2004 | Murthy et al. |
| 6,798,021 B2 | 9/2004 | Ipposhi et al. |
| 6,803,641 B2 | 10/2004 | Papa Rao et al. |
| 6,812,103 B2 | 11/2004 | Wang et al. |
| 6,815,288 B2 | 11/2004 | Kim |
| 6,821,840 B2 | 11/2004 | Wieczorek et al. |
| 6,830,962 B1 | 12/2004 | Guarini et al. |
| 6,861,318 B2 | 3/2005 | Murthy et al. |
| 6,867,101 B1 | 3/2005 | Yu |
| 6,867,433 B2 | 3/2005 | Yeo et al. |
| 6,872,610 B1 | 3/2005 | Mansoori et al. |
| 6,882,025 B2 | 4/2005 | Yeo et al. |
| 6,885,084 B2 | 4/2005 | Murthy et al. |
| 6,891,192 B2 | 5/2005 | Chen et al. |
| 6,900,502 B2 | 5/2005 | Ge et al. |
| 6,924,181 B2 | 8/2005 | Huang et al. |
| 6,936,506 B1 | 8/2005 | Buller et al. |
| 6,936,881 B2 | 8/2005 | Yeo et al. |
| 6,939,814 B2 | 9/2005 | Chan et al. |
| 6,940,705 B2 | 9/2005 | Yeo et al. |
| 6,969,618 B2 | 11/2005 | Mouli |
| 6,982,433 B2 | 1/2006 | Hoffman et al. |
| 6,998,311 B2 | 2/2006 | Forbes et al. |
| 7,029,994 B2 | 4/2006 | Ge et al. |
| 7,052,964 B2 | 5/2006 | Yeo et al. |
| 7,071,052 B2 | 7/2006 | Yeo et al. |
| 7,081,395 B2 | 7/2006 | Chi et al. |
| 7,101,742 B2 | 9/2006 | Ko et al. |
| 7,112,495 B2 | 9/2006 | Ko et al. |
| 7,164,163 B2 | 1/2007 | Chen et al. |
| 7,193,269 B2 | 3/2007 | Toda et al. |
| 7,220,630 B2 | 5/2007 | Cheng et al. |
| 7,268,024 B2 | 9/2007 | Yeo et al. |
| 7,303,955 B2 | 12/2007 | Kim |
| 7,354,843 B2 | 4/2008 | Yeo et al. |
| 7,442,967 B2 | 10/2008 | Ko et al. |
| 2001/0028089 A1 | 10/2001 | Adan |
| 2002/0008289 A1 | 1/2002 | Murota et al. |
| 2002/0031890 A1 | 3/2002 | Watanabe et al. |
| 2002/0045318 A1 | 4/2002 | Chen et al. |
| 2002/0074598 A1 | 6/2002 | Doyle et al. |
| 2002/0076899 A1 | 6/2002 | Skotnicki et al. |
| 2002/0125471 A1 | 9/2002 | Fitzgerald et al. |
| 2002/0140031 A1 | 10/2002 | Rim |
| 2002/0153549 A1 | 10/2002 | Laibowitz et al. |
| 2002/0163036 A1 | 11/2002 | Miura et al. |
| 2002/0190284 A1 | 12/2002 | Murthy et al. |

| | | | |
|---|---|---|---|
| 2003/0001219 A1 | 1/2003 | Chau et al. |
| 2003/0030091 A1 | 2/2003 | Bulsara et al. |
| 2003/0080361 A1 | 5/2003 | Murthy et al. |
| 2003/0080386 A1 | 5/2003 | Ker et al. |
| 2003/0080388 A1 | 5/2003 | Disney et al. |
| 2003/0098479 A1 | 5/2003 | Murthy et al. |
| 2003/0136985 A1 | 7/2003 | Murthy et al. |
| 2003/0162348 A1 | 8/2003 | Yeo et al. |
| 2003/0183880 A1 | 10/2003 | Goto et al. |
| 2003/0227013 A1 | 12/2003 | Currie et al. |
| 2004/0016972 A1 | 1/2004 | Singh et al. |
| 2004/0018668 A1 | 1/2004 | Maszara |
| 2004/0026765 A1 | 2/2004 | Currie et al. |
| 2004/0029323 A1 | 2/2004 | Shimizu et al. |
| 2004/0063300 A1 | 4/2004 | Chi |
| 2004/0070035 A1 | 4/2004 | Murthy et al. |
| 2004/0087098 A1 | 5/2004 | Ng et al. |
| 2004/0104405 A1 | 6/2004 | Huang et al. |
| 2004/0108598 A1 | 6/2004 | Cabral, Jr. et al. |
| 2004/0129982 A1 | 7/2004 | Oda et al. |
| 2004/0140506 A1 | 7/2004 | Singh et al. |
| 2004/0173815 A1 | 9/2004 | Yeo et al. |
| 2004/0179391 A1 | 9/2004 | Bhattacharyya |
| 2004/0217448 A1 | 11/2004 | Kumagai et al. |
| 2004/0262683 A1 | 12/2004 | Bohr et al. |
| 2004/0266116 A1 | 12/2004 | Mears et al. |
| 2005/0012087 A1 | 1/2005 | Sheu et al. |
| 2005/0029601 A1 | 2/2005 | Chen et al. |
| 2005/0035369 A1 | 2/2005 | Lin et al. |
| 2005/0035410 A1 | 2/2005 | Yeo et al. |
| 2005/0082522 A1 | 4/2005 | Huang et al. |
| 2005/0093078 A1 | 5/2005 | Chan et al. |
| 2005/0136584 A1 | 6/2005 | Boyanov et al. |
| 2005/0186722 A1 | 8/2005 | Cheng et al. |
| 2005/0224986 A1 | 10/2005 | Tseng et al. |
| 2005/0224988 A1 | 10/2005 | Tuominen |
| 2005/0236694 A1 | 10/2005 | Wu et al. |
| 2005/0266632 A1 | 12/2005 | Chen et al. |
| 2006/0001073 A1 | 1/2006 | Chen et al. |
| 2006/0121727 A1 | 6/2006 | Metz et al. |
| 2007/0040225 A1 | 2/2007 | Yang |
| 2007/0267680 A1 | 11/2007 | Uchino et al. |
| 2008/0169484 A1 | 7/2008 | Chuang et al. |
| 2009/0230439 A1 | 9/2009 | Wang et al. |

FOREIGN PATENT DOCUMENTS

| | | |
|---|---|---|
| EP | 0 828 296 A2 | 3/1998 |
| WO | WO-03/017336 A2 | 2/2003 |

OTHER PUBLICATIONS

Bednar, T. R., et al., "Issues and Strategies for the Physical Design of System-on-a-Chip ASICs," IBM Journal of Research and Development, vol. 46, No. 6, Nov. 2002, pp. 661-674.

Bianchi, R. A., et al., "Accurate Modeling of Trench Isolation Induced Mechanical Stress Effects on MOSFET Electrical Performance," IEDM, 2002, pp. 117-120.

Blaauw, D., et al., "Gate Oxide and Subthreshold Leakage Characterization, Analysis and Optimization," date unknown, 2 pages.

Cavassilas, N., et al., "Capacitance-Voltage Characteristics of Metal-Oxide-Strained Semiconductor Si/SiGe Heterostructures," Nanotech 2002, vol. 1, pp. 600-603.

Celik, M., et al., "A 45 nm Gate Length High Performance SOI Transistor for 100nm CMOS Technology Applications," 2002 Symposium on VLSI Technology Digest of Technical Papers, IEEE, pp. 166-167.

Chang, L., et al., "Direct-Tunneling Gate Leakage Current in Double-Gate and Ultrathin Body MOSFETs," IEEE Transactions on Electron Devices, vol. 49, No. 12, Dec. 2002, pp. 2288-2295.

Chang, L., et al., "Reduction of Direct-Tunneling Gate Leakage Current in Double-Gate and Ultra-Thin Body MOSFETs," IEEE, 2001, 4 pages.

Chau, R., et al., "A 50nm Depleted-Substrate CMOS Transistor (DST)," IEDM, 2001, pp. 621-624.

Chen, W., et al., "Suppression of the SOI Floating-Body Effects by Linked-Body Device Structure," 1996 Symposium on VLSI Technology Digest of Technical Papers, IEEE, pp. 92-93.

Fung, S. K. H., et al., "Gate Length Scaling Accelerated to 30nm Regime Using Ultra-Thin Film PD-SOI Technology," IEDM, 2001, pp. 629-632.

Gámiz, F., et al., "Electron Transport in Strained Si Inversion Layers Grown on SiGe-on-Insulator Substrates," Journal of Applied Physics, vol. 92, No. 1, Jul. 1, 2002, pp. 288-295.

Gámiz, F. et al., "Strained-Si/SiGe-on-Insulator Inversion Layers: The Role of Strained-Si Layer Thickness on Electron Mobility," Applied Physics Letters, vol. 80, No. 22, Jun. 3, 2002, pp. 4160-4162.

Ge, C.-H., et al., "Process-Strained Si (PSS) CMOS Technology Featuring 3D Strain Engineering," IEDM, 2003, pp. 73-76.

Geppert, L., "The Amazing Vanishing Transistor Act," IEEE Spectrum, Oct. 2002, pp. 28-33.

Ghani, T., et al., "A 90nm High Volume Manufacturing Logic Technology Featuring Novel 45nm Gate Length Strained Silicon CMOS Transistors," IEDM 2003, pp. 978-980.

Grudowski, P., et al., "1-D and 2-D Geometry Effects in Uniaxially-Strained Dual Etch Stop Layer Stressor Integrations," 2006 Symposium on VLSI Technology Digest of Technical Papers, IEEE, 2 pages.

Huang, X., et al., "Sub-50 nm P-Channel FinFET," IEEE Transactions on Electron Devices, vol. 48, No. 5, May 2001, pp. 880-886.

Ismail, K., et al., "Electron Transport Properties of Si/SiGe Heterostructures: Measurements and Device Implications," Applied Physics Letters, vol. 63, No. 5, Aug. 2, 1993, pp. 660-662.

Ito, S., et al., "Mechanical Stress Effect of Etch-Stop Nitride and Its Impact on Deep Submicron Transistor Design," IEDM, 2000, pp. 247-250.

Jurczak, M., et al., "Silicon-on-Nothing (SON)—an Innovative Process for Advanced CMOS," IEEE Transactions on Electron Devices, vol. 47, No. 11, Nov. 2000, pp. 2179-2187.

Jurczak, M., et al., "SON (Silicon on Nothing)—A New Device Architecture for the ULSI Era," 1999 Symposium on VLSI Technology Digest of Technical Papers, IEEE, pp. 29-30.

Kanda, Y., "A Graphical Representation of the Piezoresistance Coefficients in Silicon," IEEE Transactions on Electron Devices, vol. ED-29, No. 1, Jan. 1982, pp. 64-70.

Leitz, C. W., et al., "Channel Engineering of SiGe-Based Heterostructures for High Mobility MOSFETs," Materials Research Society Symposium Proceedings, vol. 686, 2002, pp. 113-118.

Leitz, C. W. et al., "Hole Mobility Enhancements in Strained $Si/Si_{1-y}Ge_y$ P-Type Metal-Oxide-Semiconductor Field-Effect Transistors Grown on Relaxed $Si_{1-x}Ge_x$ (x<y) Virtual Substrates," Applied Physics Letters, vol. 79, No. 25, Dec. 17, 2001, pp. 4246-4248.

Liu, K. C., et al., "A Novel Sidewall Strained-Si Channel nMOSFET," IEDM, 1999, pp. 63-66.

Maiti, C. K., et al., "Film Growth and Material Parameters," Application of Silicon-Germanium Heterostructure, Ch. 2, Institute of Physics Publishing, pp. 32-42.

Matthews, J. W., "Defects Associated with the Accommodation of Misfit between Crystals," The Journal of Vacuum Science and Technology, vol. 12, No. 1, Jan./Feb. 1975, pp. 126-133.

Matthews, J. W., et al., "Defects in Epitaxial Multilayers—I. Misfit Dislocations," Journal of Crystal Growth, vol. 27, 1974, pp. 118-125.

Matthews, J. W., et al., "Defects in Epitaxial Multilayers—II. Dislocation Pile-Ups, Threading Dislocations, Slip Lines and Cracks," Journal of Crystal Growth, vol. 29, 1975, pp. 273-280.

Matthews, J. W. et al., "Defects in Epitaxial Multilayers—III. Preparation of Almost Perfect Multilayers," Journal of Crystal Growth, vol. 32, 1976, pp. 265-273.

Mizuno, T., et al., "Novel SOI p-Channel MOSFETs with Higher Strain in Si Channel Using Double SiGe Heterostructures," IEEE Transactions on Electron Devices, vol. 49, No. 1, Jan. 2002, pp. 7-14.

Nayak, D. K., et al., "Enhancement-Mode Quantum-Well $Ge_xSi_{1-x}$ PMOS," IEEE Electron Device Letters, vol. 12, No. 4, April 1991, pp. 154-156.

Ootsuka, F., et al., "A Highly Dense, High-Performance 130nm Node CMOS Technology for Large Scale System-on-a-Chip Applications," IEDM, 2000, pp. 575-578.

Ota, K., et al., "Novel Locally Strained Channel Technique for High Performance 55nm CMOS," IEDM, 2002, pp. 27-30.

Rim, K., et al., "Fabrication and Analysis of Deep Submicron Strained-Si N-MOSFET's," IEEE Transactions on Electron Devices, vol. 47, No. 7, Jul. 2000, pp. 1406-1415.

Rim, K., "Strained Si Surface Channel MOSFETs for High-Performance CMOS Technology," IEEE International Solid-State Circuits Conference, Digest of Technical Papers, 2001, pp. 116-117.

Schüppen, A., et al., "Mesa and Planar SiGe-HBTs on MBE-Wafers," Journal of Materials Science: Materials in Electronics, vol. 6, 1995, pp. 298-305.

Scott, G., et al., "NMOS Drive Current Reduction Caused by Transistor Layout and Trench Isolation Induced Stress," IEDM, 1999, pp. 827-830.

Shahidi, G. G., "SOI Technology for the GHz Era," IBM Journal of Research and Development, vol. 46, No. 2/3, Mar./May 2002, pp. 121-131.

Shimizu, A., et al., "Local Mechanical-Stress Control (LMC): A New Technique for CMOS-Performance Enhancement," IEDM, 2001, pp. 433-436.

Tezuka, T., et al., "High-Performance Strained Si-on-Insulator MOSFETs by Novel Fabrication Processes Utilizing Ge-Condensation Technique," 2002 Symposium on VLSI Technology Digest of Technical Papers, IEEE, pp. 96-97.

Thompson, S., et al., "A 90 nm Logic Technology Featuring 50nm Strained Silicon Channel Transistors, 7 Layers of Cu Interconnects, Low k ILD, and 1 μm² SRAM Cell," IEDM, 2002, pp. 61-64.

Tiwari, S., et al., "Hole Mobility Improvement in Silicon-on-Insulator and Bulk Silicon Transistors Using Local Strain," IEDM, 1997, pp. 939-941.

Uejima, K., et al., "Highly Efficient Stress Transfer Techniques in Dual Stress Liner CMOS Integration," 2007 Symposium on VLSI Technology Digest of Technical Papers, IEEE, 2007, pp. 220-221.

Wang, L. K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Welser, J., et al., "NMOS and PMOS Transistors Fabricated in Strained Silicon/Relaxed Silicon-Germanium Structures," IEDM, 1992, pp. 1000-1002.

Wong, H.-S. P., "Beyond the Conventional Transistor," IBM Journal of Research and Development, vol. 46, No. 2/3, Mar./May 2002, pp. 133-167.

Yang, F.-L., et al., "25 nm CMOS Omega FETs," IEDM, 2002, pp. 255-258.

Yang, F.-L., et al., "35nm CMOS FinFET5," 2002 Symposium on VLSI Technology Digest of Technical Papers, IEEE, pp. 104-105.

Yeo, Y.-C., et al., "Enhanced Performance in Sub-100 nm CMOSFETs Using Strained Epitaxial Silicon-Germanium,"IEDM, 2000, pp. 753-756.

Yeoh, J. C., et al., "MOS Gated Si:SiGe Quantum Wells Formed by Anodic Oxidation," Semiconductor Science and Technology, vol. 13, 1998, pp. 1442-1445.

Wolf, S., et al., "Silicon Processing for the VLSI Era," vol. 1: Process Technology, Second Edition, Lattice Press, Sunset Beach, CA, 2000, pp. 834-835.

Wolf, S., et al., "Silicon Processing for the VLSI Era," vol. 2: Process Integration, Lattice Press, Sunset Beach, CA, 1990, pp. 144-145.

Wolf, S., et al., "Silicon Processing for the VLSI Era," vol. 1: Process Technology, Second Edition, Lattice Press, Sunset Beach, CA, 2000, pp. 374-385.

Wolf, S., et al., "Silicon Processing for the VLSI Era," vol. 2: Process Integration, Lattice Press, Sunset Beach, CA, 1990, pp. 658-663.

* cited by examiner

STANDARD CELL WITHOUT OD SPACE EFFECT IN Y-DIRECTION

This application claims priority to U.S. Provisional Patent Application Ser. No. 61/101,002, filed Sep. 29, 2008, and entitled, "Standard Cell without OD Space Effect in Y-Direction," which application is hereby incorporated herein by reference.

CROSS-REFERENCE TO RELATED APPLICATIONS

This patent application is related to the following co-pending U.S. Patent Applications: U.S. patent application Ser. No. 11/849,798, filed Sep. 4, 2007, and entitled "Strained Transistor with Optimized Drive Current and Method of Forming," and U.S. patent application Ser. No. 12/048,135, filed Mar. 13, 2008, and entitled "Strain Bars in Stressed Layers of MOS Devices," which patent applications are incorporated herein by reference.

TECHNICAL FIELD

This invention relates generally to semiconductor devices, and more particularly to metal-oxide-semiconductor (MOS) devices, and even more particularly to improving stresses in MOS devices.

BACKGROUND

Reductions in the size and inherent features of semiconductor devices, for example, metal-oxide semiconductor (MOS) devices, have enabled continued improvements in speed, performance, density, and cost per unit function of integrated circuits over the past few decades. In accordance with a design of the MOS device and one of the inherent characteristics thereof, modulating the length of a channel region underlying a gate between a source and a drain of a MOS device alters a resistance associated with the channel region, thereby affecting the performance of the MOS device. More specifically, shortening the length of the channel region reduces a source-to-drain resistance of the MOS device, which, assuming other parameters are maintained relatively constant, may allow for an increase in current flow between the source and drain when a sufficient voltage is applied to the gate of the MOS device.

To further enhance the performance of MOS devices, stresses may be introduced in the channel region of a MOS device to improve its carrier mobility, which in turn causes the improvement in saturation current, and hence the speed. Generally, it is desirable to induce a tensile stress in the channel region of an n-type MOS (NMOS) device in a source-to-drain direction (channel-length direction) and to induce a compressive stress in the channel region of a p-type MOS (PMOS) device in the channel-length direction. On the other hand, PMOS and NMOS devices both benefit from tensile stresses in the channel-width direction.

Stresses may be applied to MOS devices in various ways, for example, through stressed etch stop layers and/or stressed shallow trench isolation (STI) regions. FIG. 1 illustrates a layout of a portion of a standard cell, which includes PMOS device 2 and NMOS device 4. PMOS device 2 includes active region 6 and gate electrode 10 over active region 6. NMOS device 4 includes active region 8 and gate electrode 10 over active region 8. The channel regions of PMOS device 2 and NMOS device 4 include portions of active regions 6 and 8 underlying gate electrode 10, respectively.

Assuming there is another active region 12 spaced apart from active region 6 by STI region 14, wherein the spacing between active region 12 and active region 6 is S1, STI region 14 typically applies a compressive stress to active region 6, and hence adversely affects the drive current of PMOS device 2. Further, the magnitude of the stress applied by STI region 14 is affected by the value of spacing S1, and the greater S1 is, the greater the stress will be. On a semiconductor chip formed using standard cell design, there are typically many standard cells placed relatively randomly, and hence the spacing S1 for one standard cell may be significantly different from the spacing S1 for another standard cell. This causes significant variation of the drive currents of the MOS devices. Further, some of the spacings S1 for some of the MOS devices may be so great that the drive currents of the respective MOS devices are affected to a degree not acceptable to certain design. New standard cells are thus needed to solve the above-discussed problems.

SUMMARY OF THE INVENTION

In accordance with one aspect of the present invention, an integrated circuit structure includes a semiconductor substrate; a first active region in the semiconductor substrate; and a second active region in the semiconductor substrate and of an opposite conductivity type than the first active region. A gate electrode strip is over the first and the second active regions and forms a first MOS device and a second MOS device with the first active region and the second active region, respectively. A first spacer bar is in the semiconductor substrate and connected to the first active region. At least a portion of the first spacer bar is adjacent to and spaced apart from a portion of the first active region. A second spacer bar is in the semiconductor substrate and connected to the second active region. At least a portion of the second spacer bar is adjacent to and spaced apart from a portion of the second active region.

In accordance with another aspect of the present invention, an integrated circuit structure includes a semiconductor substrate; a first active region in the semiconductor substrate; and a second active region in the semiconductor substrate and of an opposite conductivity type than the first active region. A gate electrode strip is over the first and the second active regions and forms a first MOS device and a second MOS device with the first active region and the second active region, respectively. A first spacer bar is in the semiconductor substrate and of a same conductivity type as the first active region. The first spacer bar is an active region adjacent to and disconnected from the first active region. A second spacer bar is in the semiconductor substrate and of a same conductivity type as the second active region. The second spacer bar is an additional active region adjacent to and disconnected from the second active region.

In accordance with yet another aspect of the present invention, an integrated circuit structure includes a standard cell including a first boundary, a second boundary, a third boundary, and a fourth boundary. The first boundary and the second boundary are on opposite ends of the standard cell, and the third boundary and the fourth boundary are on opposite ends of the standard cell. The standard cell includes a semiconductor substrate; an active region in the semiconductor substrate; a gate electrode strip over the active region; and a spacer bar being an additional active region in the semiconductor substrate. The spacer bar adjoins an entirety of the third boundary, a portion of the first boundary, and a portion of the second boundary. The spacer bar and the active region are of a first conductivity type. An insulation region is formed in the semiconductor substrate. The insulation region is between and adjoining at least a portion of the active region and at least a portion of the spacer bar.

The advantageous features of the present invention include regulated spacing (in Y-direction) between the active region of one MOS device and neighboring active regions, and the performance of MOS devices is more predictable.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel integrated circuits including spacer bars for regulating stresses applied on metal-oxide-semiconductor (MOS) devices are presented. The preferred embodiments and the variations of the preferred embodiments are discussed. Throughout the various views and illustrative embodiments of the present invention, like reference numbers are used to designate like elements.

Figure 1:
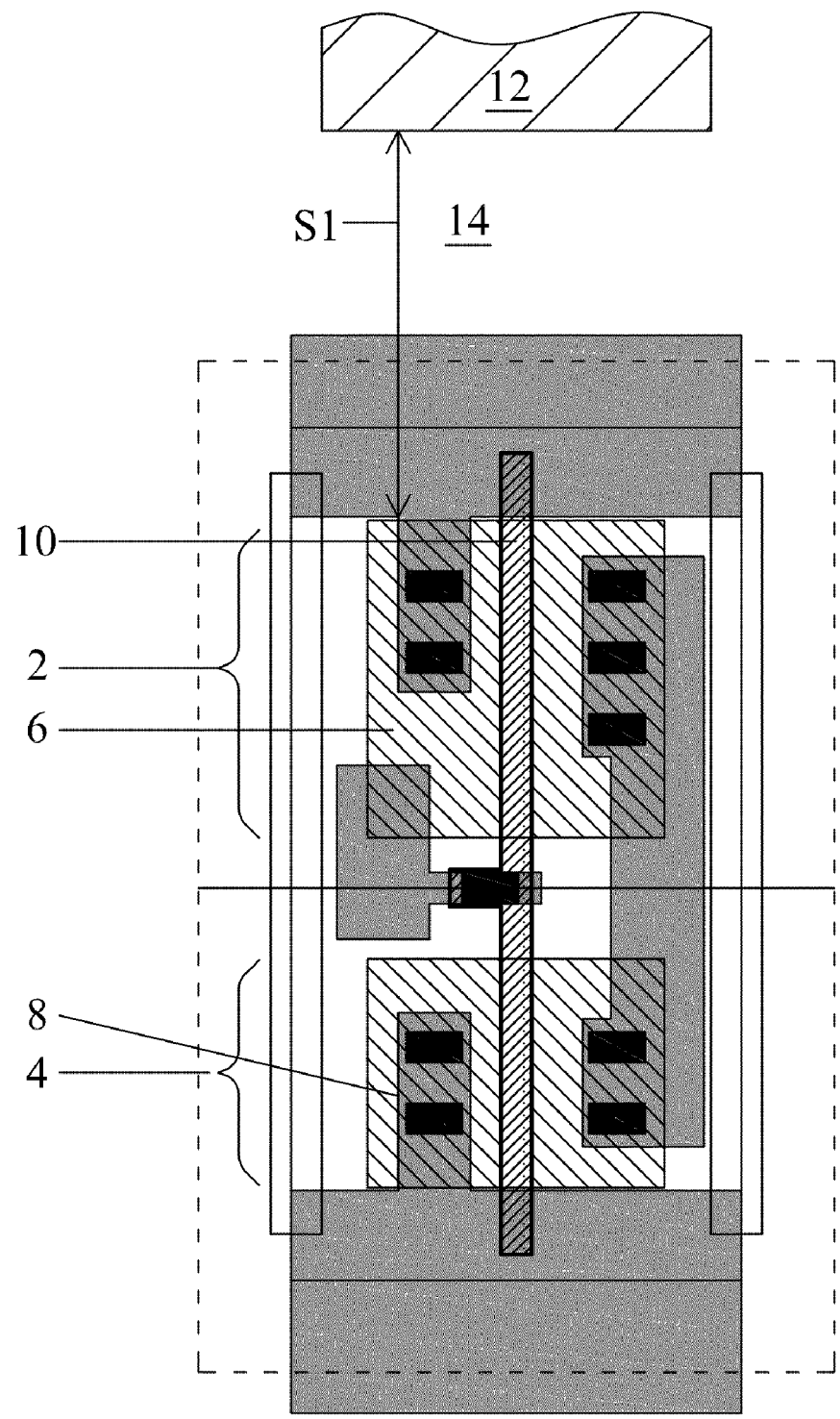
FIG. 1 illustrates a conventional standard cell, wherein spacings between active regions in the MOS devices in the standard cell and neighboring active regions depend on where the standard cell is located.
Figure 2A:
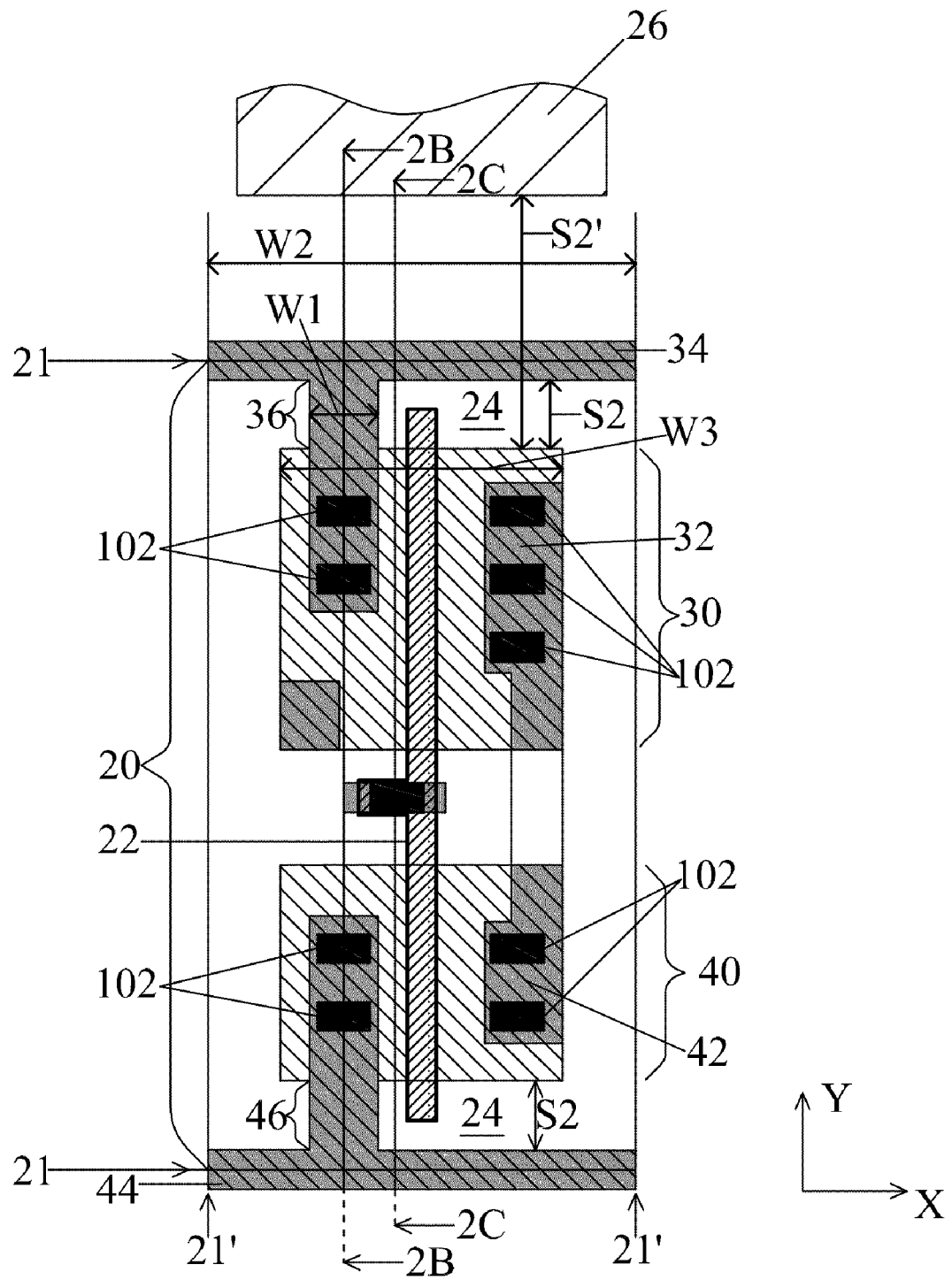
FIGS. 2A, 2B, and 2C are a top view and cross-sectional views of intermediate stages in the manufacturing of an embodiment of the present invention.

FIG. 2A illustrates an embodiment of the present invention. A portion of standard cell 20, which has certain logic function, is provided. The illustrated standard cell 20 includes PMOS device 30 and NMOS device 40 forming, for example, an inverter, although standard cell 20 may include more MOS devices (not shown, refer to FIGS. 4 and 5). The upper boundary and the lower boundary of standard cell 20 are marked using arrows 21, and the left and right boundaries are marked using arrows 21'. PMOS device 30 includes active region 32 and a portion of gate electrode strip 22 overlying active region 32. NMOS device 40 includes active region 42 and a portion of gate electrode strip 22 overlying active region 42. As is known in the art, portions of active region 32 on opposite sides of gate electrode strip 22 form source and drain regions of PMOS device 30, and portions of active region 42 on opposite sides of gate electrode strip 22 form source and drain regions of NMOS device 40.

Active region 32 is heavily doped to p-type, and active region 42 is heavily doped to n-type. Contact plugs 102 are formed over and electrically connecting the source and drain regions of the respective MOS devices 30 and 40 to the overlying metal lines in metallization layers (not shown).

Figure 2B:
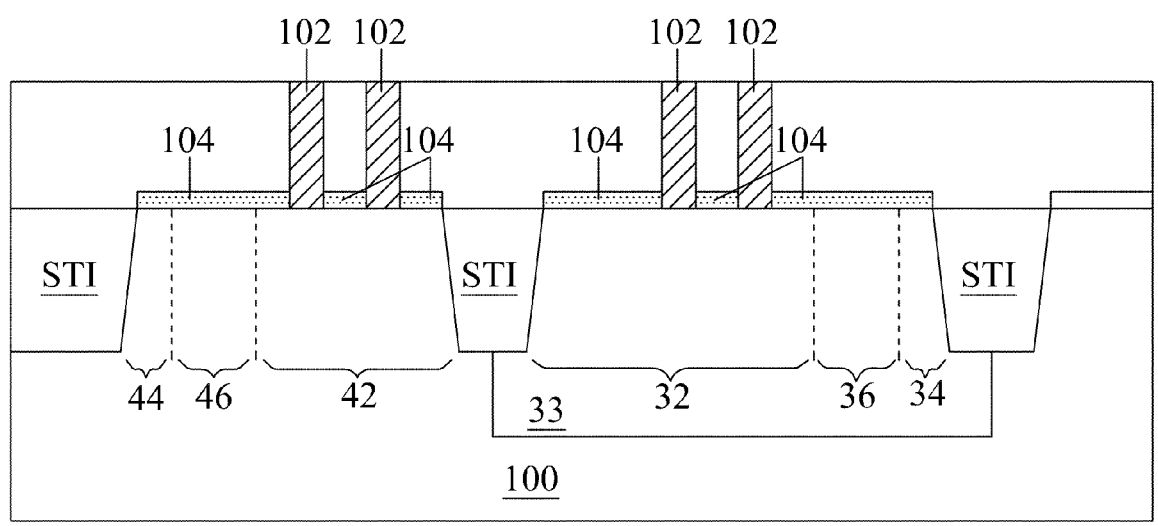
Figure 2C:
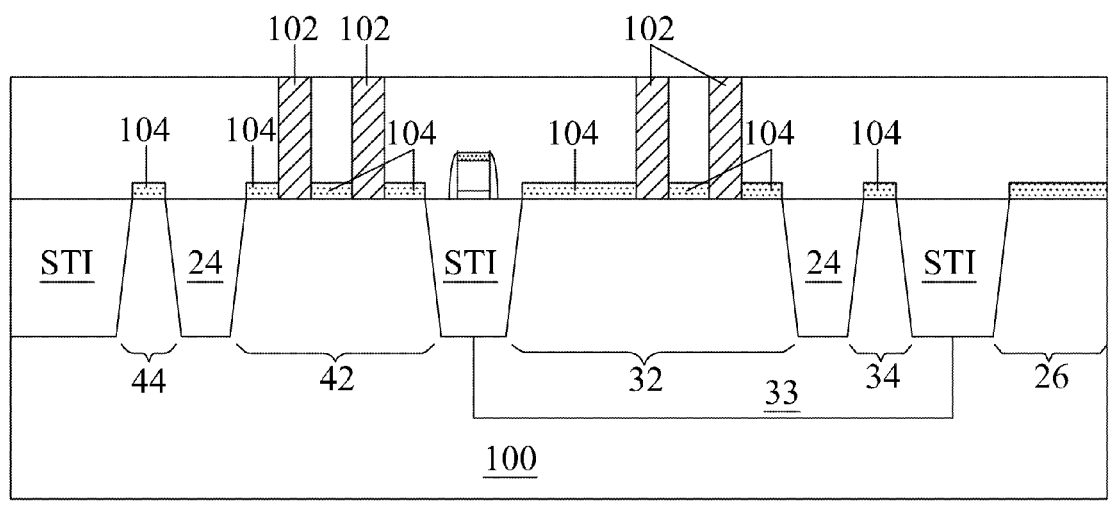

Spacer bars 34 and 44 are formed at the boundaries of standard cell 20. FIGS. 2B and 2C illustrate cross-sectional views of the structure shown in FIG. 2A, wherein the cross-sectional views are taken in planes crossing line 2B-2B and line 2C-2C in FIG. 2A, respectively. FIGS. 2B and 2C illustrate that spacer bars 34 and 44 are portions of substrate 100, and are defined by shallow trench isolation (STI) regions 24 and other STI regions. Spacer bars 34 and 44 are also referred to as active regions or dummy active regions. Further, spacer bars 34 and 44 may be formed simultaneously with, and include substantially same materials as, active regions 32 and 42, respectively, although they can also be formed at different times and include different materials. In a subsequent salicide process, silicide regions 104 may also be formed on spacer bars 34 and 44, wherein silicide regions 104 extend continuously from over active region 32 to over active regions 36 and 34 (refer to FIG. 2B), and from over active region 42 to over active regions 46 and 44.

Referring back to FIG. 2A, in an embodiment, each of spacer bars 34 and 44 has a portion (for example, about one half) inside standard cell 20 and another portion outside standard cell 20. The portions of spacer bars 34 and 44 outside standard cell 20 may actually be in other standard cells abutting standard cell 20. Accordingly, if standard cell 20 is considered to be a unit separated from others, spacer bars 34 and 44 adjoin boundaries 21, so that when other standard cells are placed abutting standard cell 20 from the Y-direction (the channel-width direction of PMOS device 30 and NMOS device 40), their spacer bars 34 and 44 will join spacer bars 34 and 44 of standard cell 20, respectively. Preferably, spacer bars 34 and 44 adjoin the left boundary 21' and right boundary 21' of standard cell 20, so that when other standard cells are placed abutting standard cell 20 from the X-direction (the channel-length direction of PMOS device 30 and NMOS device 40), their spacer bars 34 and 44 join the spacer bars 34 and 44 of standard cell 20, respectively. It is realized, however, that standard cell 20 may include more MOS devices, and spacer bars 34 and 44 will extend further, accordingly. In alternative embodiments, spacer bars 34 and 44 are spaced apart from the respective boundaries 21 by STI regions. Accordingly, standard cell 20 will not share a common spacer bar with abutting standard cells in Y-directions.

Spacer bar 34 may adjoin active region 36. Accordingly, spacer bar 34, active region 32, and active region 36 may form a continuous active region (refer to FIG. 2B). In an embodiment, one or both of spacer bar 34 and active region 36 is doped to be of p-type, wherein the dopant may be introduced at the same time the source and drain regions of PMOS device 30 are formed. In an alternative embodiment, one or both of spacer bar 34 and active region 36 is not doped when the source and drain regions of PMOS device 30 are formed. Accordingly, spacer bar 34 and active region 36 may be of n-type and have substantially a same impurity concentration as the respective n-well 33 (refer to FIGS. 2B and 2C), in which PMOS device 30 is located. Active region 36 preferably has a small width W1 (FIG. 2A), which is preferably less than about 20 percent of width W2 of standard cell 20. In addition, width W1 may be less than about 30 percent of width W3 of active region 32.

Please note that spacer bar 34 is different from the conventional pickup regions that may be formed close to PMOS device 30. Since the conventional pickup regions need to have the same conductivity type as the n-well in which PMOS device 30 is formed, the conventional pickup regions have to be doped heavily with n-type impurities. Preferably, no pickup region is formed inside standard cell 20, although one may be formed.

Similarly, spacer bar 44 may adjoin active region 46. Accordingly, spacer bar 44, active region 42 and active region 46 form a continuous active region (also refer to FIG. 2B). In an embodiment, one or both of spacer bar 44 and active region 46 is doped to be of n-type, wherein the dopant may be introduced at the same time the source and drain regions of NMOS device 40 are formed. In alternative embodiments, one or both of spacer bar 44 and active region 46 is not doped when the source and drain regions of PMOS device 40 are formed. Accordingly, spacer bar 44 and active region 46 may be of p-type and have a same impurity concentration as the respective p-well (if any, not shown) or p-type substrate 100 (refer to FIGS. 2B and 2C), in which NMOS device 40 is located.

Spacer bar 34 and active region 32 have a pre-determined spacing S2, which is fixed. This advantageously regulates the stress applied by STI region 24 to active region 32, regardless whether the stress is tensile or compressive. As a comparison, if spacer bar 34 is not formed, STI region 24 may extend in the Y-direction for spacing S2' until it reaches another active region (or dummy active region) 26. In that case, the magnitude of the stress depends on where standard cell 20 is placed in the respective chip. Since spacing S2' may vary significantly depending on where standard cell 20 is located, the magnitudes of the stresses applied by STI regions 24 vary significantly, and hence the performance of the respective MOS devices is not predictable. However, with the formation of spacer bars 34 and 44, the stresses, and hence the performance of PMOS device 30 and NMOS device 40 are regulated and are predictable.

Figure 3:
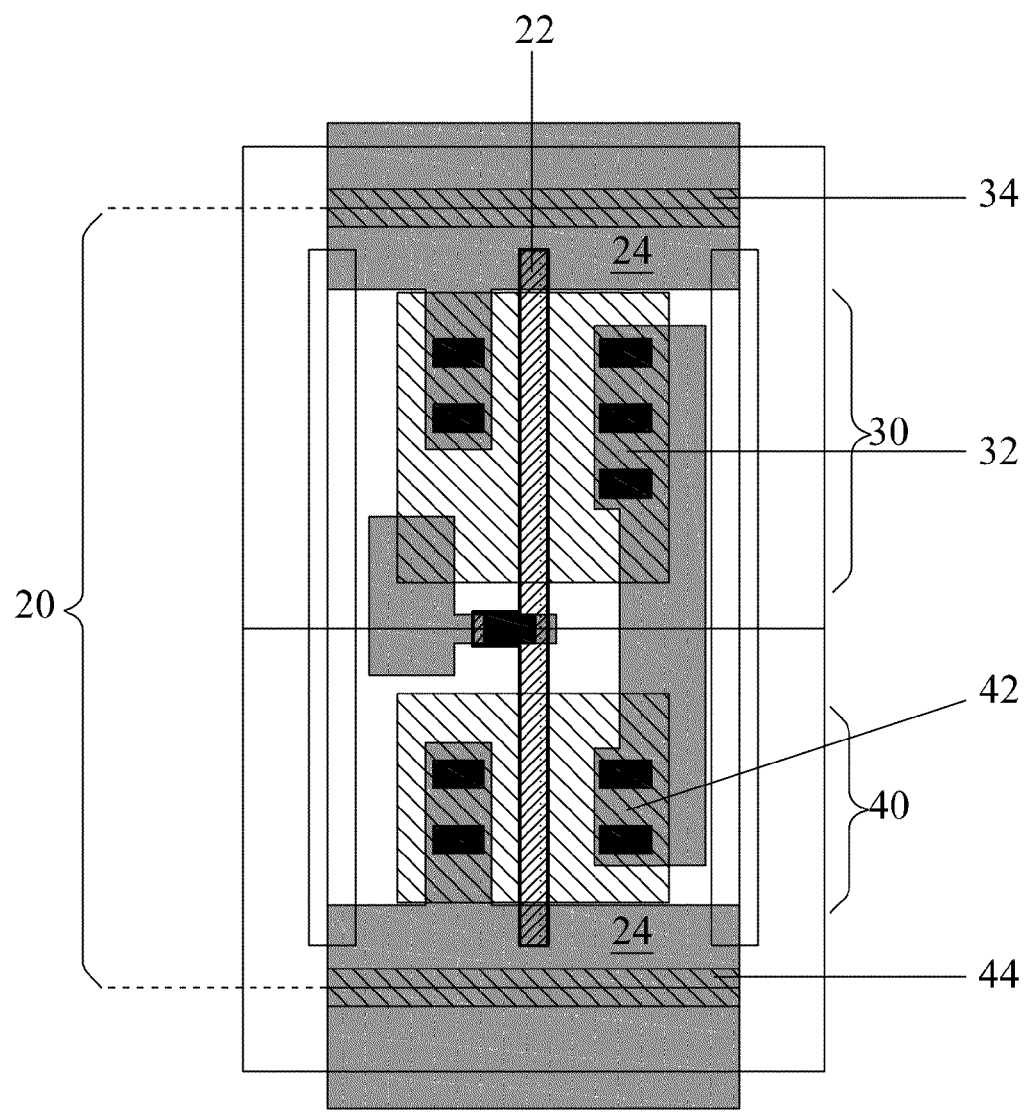
FIG. 3 illustrates an embodiment with spacer bars disconnected from the active regions.

Spacer bars 34 and/or 44 may be disconnected from the respective active regions 32 and 42, as is shown in FIG. 3. The embodiment as illustrated in FIG. 3 is essentially the same as the embodiment shown in FIGS. 2A, 2B, and 2C, except active regions 36 and 46 are replaced by STI regions 24. Spacer bar 34 (which may be of p-type) may thus be electrically floating in the underlying n-well region 33 (refer to FIGS. 2B and 2C), although it may be electrically connected to other features or voltage sources, such as ground. Similarly, spacer bar 44 (which may be of n-type) may be electrically floating in the underlying p-well (if any, not shown) or p-type substrate 100 (refer to FIGS. 2B and 2C), although it may be electrically connected to other features or voltage sources, such as ground.

Figure 4:
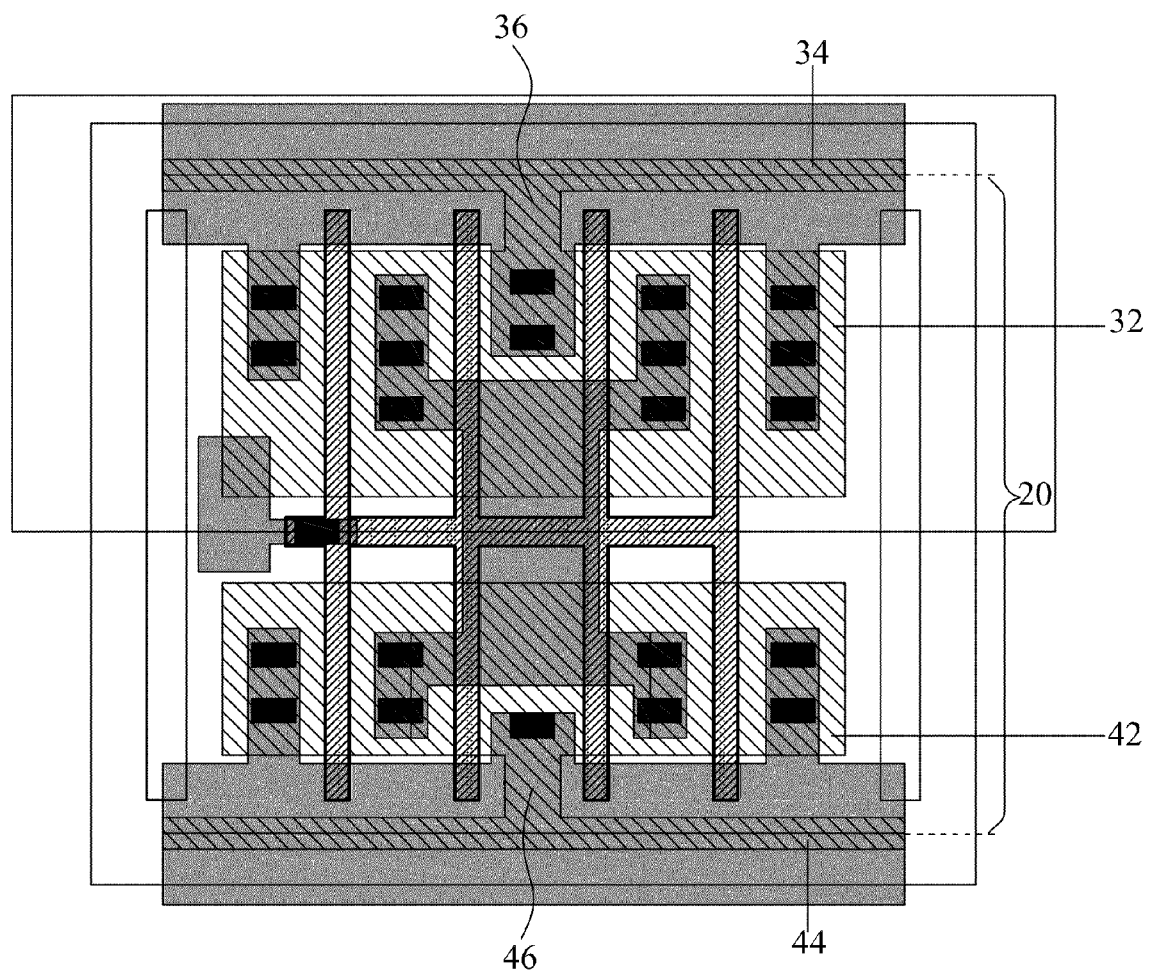
FIGS. 4 and 5 are embodiments in which standard cells include a plurality of inverters connected in parallel.
Figure 5:
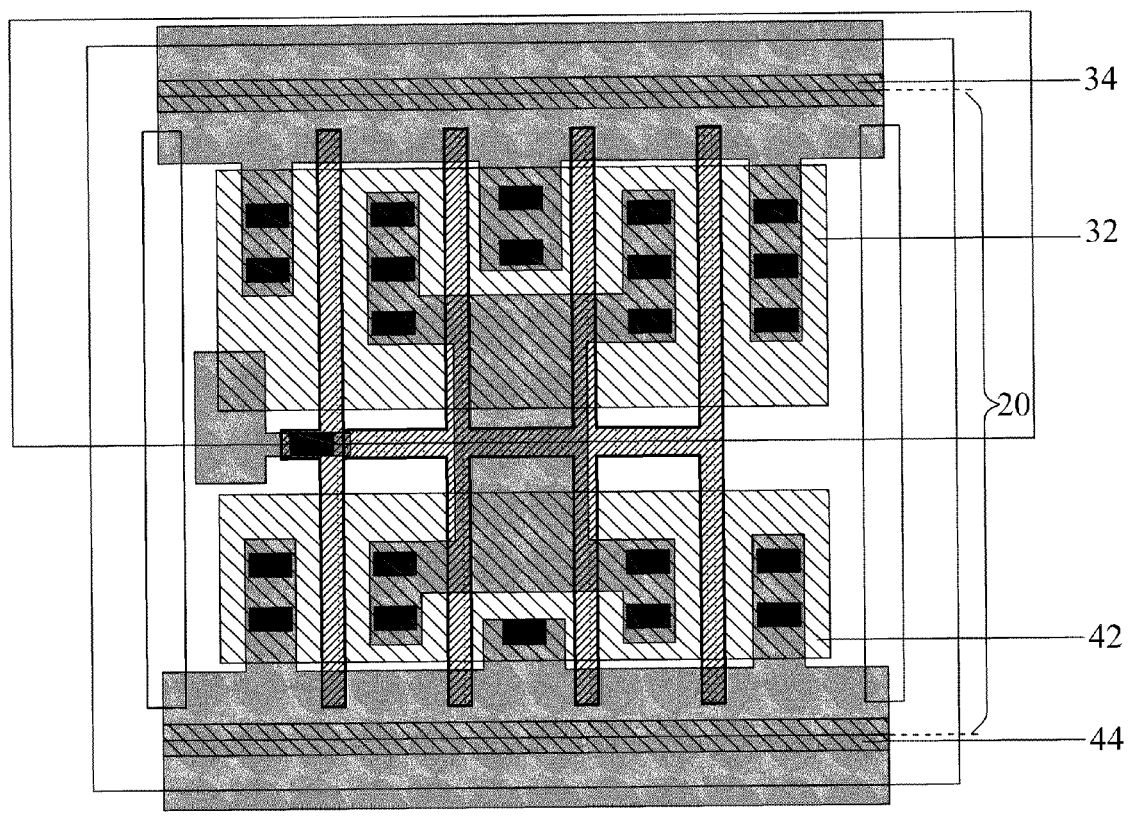

FIG. 4 illustrates standard cell 20 formed of four inverters connected in parallel. Similar to the embodiment shown in FIGS. 2A and 2B, spacer bars 34 and 44 are formed to limit the spacing between active regions 32 and 42 and their respective neighboring active regions. Spacer bars 34 and 44 are connected to active regions 32 and 42 through active regions 36 and 46, respectively. FIG. 5 illustrates a similar structure as shown in FIG. 4, except spacer bars 34 and 44 are disconnected from respective active regions 32 and 42.

Figure 6:
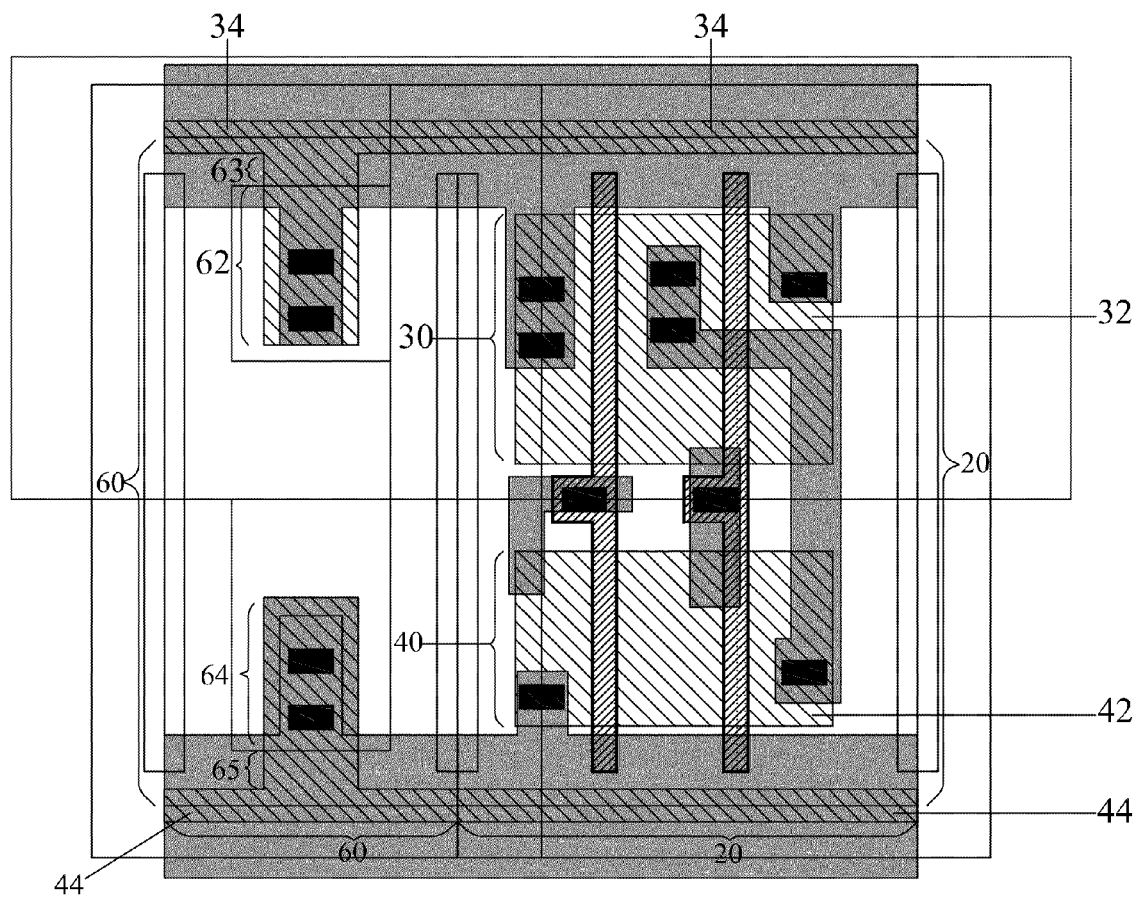
FIG. 6 illustrates a layout of a tap cell.

FIG. 6 illustrates tap cell 60, which may act as a pickup cell for n-well regions and p-well regions (or p-type substrate). An additional standard cell 20 is also illustrated to show how tap cell 60 may adjoin standard cell 20. Tap cell 60 includes heavily doped n-type region 62 and heavily doped p-type region 64. N-type region 62 acts as the pickup region for the n-well region 33 as shown in FIGS. 2B and 2C, in which PMOS device 30 is located, and p-type region 64 acts as the pickup region for the p-well (not shown) or p-type substrate 100 (refer to FIGS. 2B and 2C) in which NMOS device 40 is located. N-type region 62 may abut spacer bar 34, which may be of p-type. In other embodiments, p-type region 63 is formed to adjoin spacer bar 34 and n-type region 62. In yet other embodiments, the region marked as 63 is an STI region separating n-type region 62 from spacer bar 34. Similarly, p-type region 64 may abut spacer bar 44, which may be of n-type. In other embodiments, n-type region 65 is formed to adjoin spacer bar 44 and p-type region 64. In yet other embodiments, the region marked as 65 is an STI region separating n-type region 64 from spacer bar 44.

Figure 7:
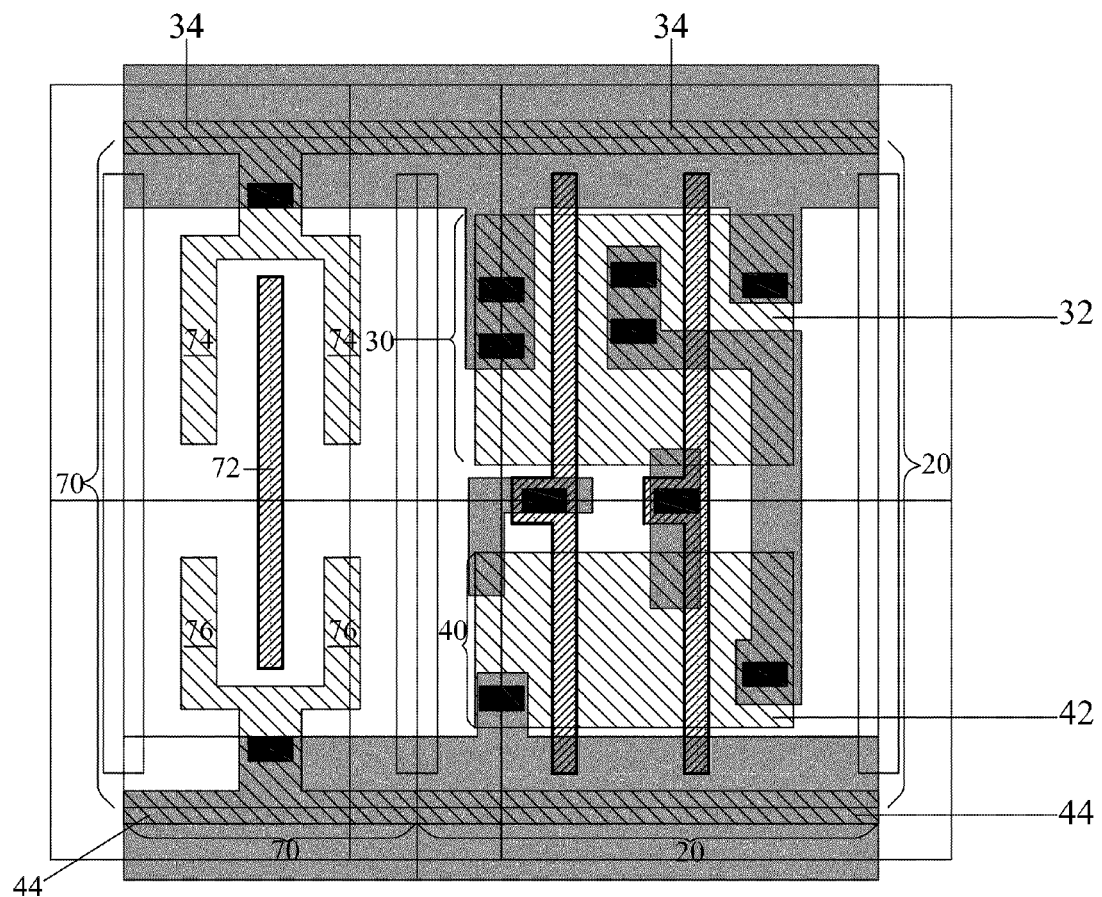
FIG. 7 illustrates a layout of a filler cell.

FIG. 7 illustrates filler cell 70, which is used to fill un-used chip areas. An additional standard cell 20 is also illustrated to shown how filler cell 70 may adjoin standard cell 20. Filler cell 70 includes dummy gate electrode strip (commonly referred to as gate poly) 72 and dummy active regions 74 and 76. Preferably, for process convenience, dummy active region 74 is of p-type, while dummy active region 76 is of n-type, although they can also be doped to same conductivity types. Spacer bars 34 and 44 may be built into filler cell 70, so that when filler cell 70 is placed next to standard cell 20, spacer bars 34 and 44 are automatically connected to form extended strips extending from filler cell 70 into standard cell 20.

Figure 8:
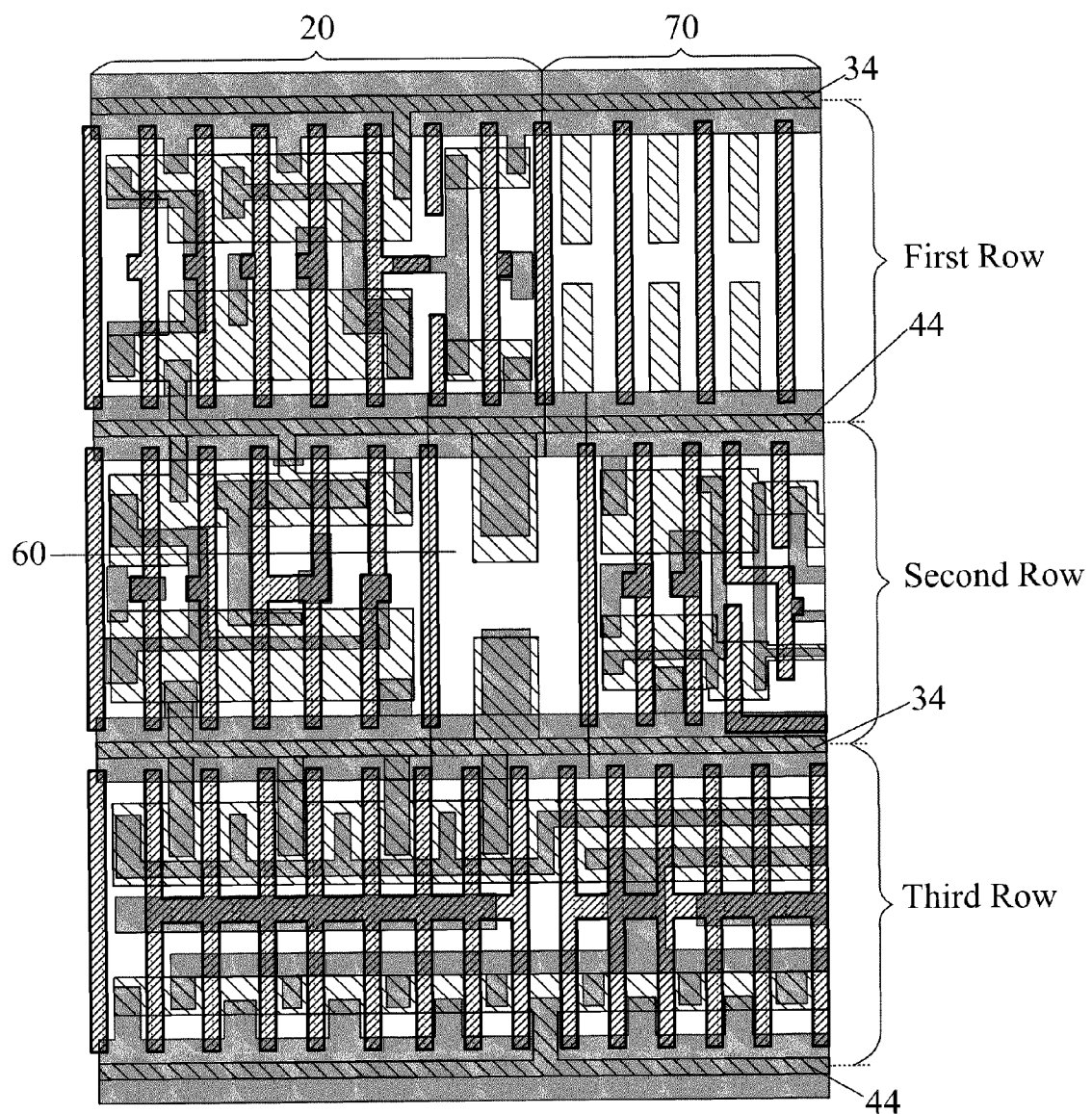
FIG. 8 illustrates a layout of a circuit including standard cells, a tap cell, and filler cells, wherein the cells are arranged into a plurality of rows.

FIG. 8 illustrates how standard cells 20, tap cell 60, and filler cells 70 are integrated. FIG. 8 includes three rows of cells, with the first row and the second row sharing a common spacer bar 44. Similarly, spacer bar 34 is also shared by the second row and the third row. It is noted that spacer bars 34 in standard cells 20, tap cell 60, and filler cells 70 form a long spacer bar extending throughout the row, and spacer bars 44 in standard cells 20, tap cell 60, and filler cells 70 also form a long spacer bar extending throughout the row. Accordingly, the spacing between any of the PMOS devices and the neighboring active regions in the Y-direction is limited by the built-in spacer bars 34 and 44, and hence the spacing fluctuates in a controlled range regardless what structures are in neighboring rows.

Although in the embodiments discussed in the preceding paragraphs, spacer bars are described as being formed in standard cells, they can also be formed in other structures other than standard cells. In addition, spacer bars 34 and 44 can be formed substantially in parallel to each other and/or substantially vertical to the gate electrode strips 22 in standard cells.

Figure 9:
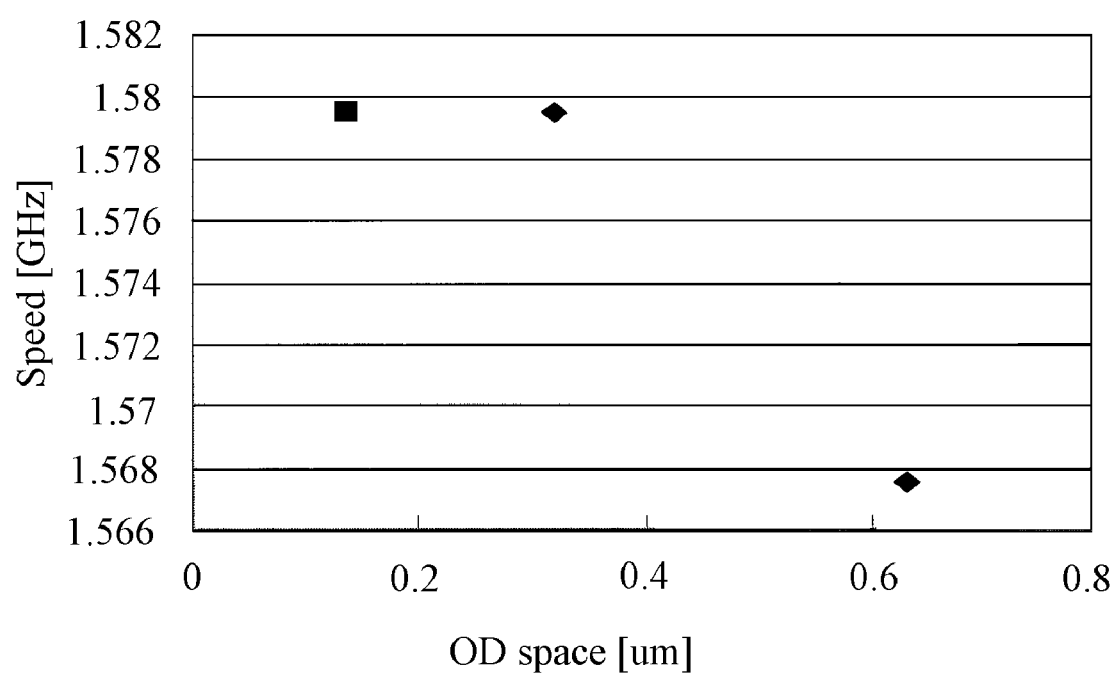
FIG. 9 illustrates a simulation result.

The embodiments of the present invention have several advantageous features. By limiting the spacing between neighboring active regions in Y-directions, the performance variation of MOS devices is limited in a predictable range. FIG. 9 illustrates simulation results performed on a benchmark circuit comprising five different circuits. The X-axis indicates the Y-direction spacing (OD space) between neighboring active regions, and the Y-axis indicates the speed of the benchmark circuit. It is noted that when the spacing is allowed to fluctuate between about 0.3 µm and about 0.6 µm, the speed of the benchmark circuit varies between about 1.568 GHz to about 1.58 GHz. By using the embodiments of the present invention, however, the speed of the benchmark circuit is fixed at around 1.58 GHz. The embodiments of the present invention do not require additional mask and process steps, and hence the advantageous features of the present invention may be obtained with no additional manufacturing cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a semiconductor substrate;
   a first active region in the semiconductor substrate;
   a second active region in the semiconductor substrate and of an opposite conductivity type than the first active region;
   a gate electrode strip over the first and the second active regions and forming a first MOS device and a second MOS device with the first active region and the second active region, respectively;
   a first spacer bar in the semiconductor substrate and connected to the first active region, wherein at least a portion of the first spacer bar is adjacent to and spaced apart from a portion of the first active region; and
   a second spacer bar in the semiconductor substrate and connected to the second active region, wherein at least a portion of the second spacer bar is adjacent to and spaced apart from a portion of the second active region.

2. The integrated circuit structure of claim 1, wherein the first spacer bar, the second spacer bar, the first MOS device, and the second MOS device are within boundaries of a standard cell.

3. The integrated circuit structure of claim 2, wherein each of the first spacer bar and the second spacer bar adjoins three boundaries of the standard cell.

4. The integrated circuit structure of claim 1, wherein the first spacer bar and the first active region are both of a first conductivity type.

5. The integrated circuit structure of claim 4, wherein the second spacer bar and the second active region are both of a second conductivity type opposite the first conductivity type.

6. The integrated circuit structure of claim 5 further comprising:
   a third active region in the semiconductor substrate and of a same conductivity type as the first spacer bar and the first active region; and
   a fourth active region in the semiconductor substrate and of a same conductivity type as the second spacer bar and the second active region, wherein the third active region is between and adjoining the first spacer bar and the first active region, and the fourth active region is between and adjoining the second spacer bar and the second active region.

7. The integrated circuit structure of claim 1, wherein the first active region and the first spacer bar are fully separated from each other by a first shallow trench isolation (STI) region, and wherein the second active region and the second spacer bar are fully separated from each other by a second STI region.

8. The integrated circuit structure of claim 1 further comprising a tap cell comprising a pickup region for a well region, wherein the first active region is in the well region, and wherein the tap cell further comprises a third spacer bar adjoining, and of a same conductivity type as, the first spacer bar.

9. The integrated circuit structure of claim 1 further comprising a filler cell comprising a dummy gate electrode strip and a dummy active region, wherein the filler cell further comprises a third spacer bar adjoining, and of a same conductivity type as, the first spacer bar.

10. An integrated circuit structure comprising:
    a semiconductor substrate;
    a first active region in the semiconductor substrate;
    a second active region in the semiconductor substrate and of an opposite conductivity type than the first active region;
    a gate electrode strip over the first and the second active regions and forming a first MOS device and a second MOS device with the first active region and the second active region, respectively;
    a first spacer bar in the semiconductor substrate and of a same conductivity type as the first active region, wherein the first spacer bar is an active region adjacent to and disconnected from the first active region; and
    a second spacer bar in the semiconductor substrate and of a same conductivity type as the second active region, wherein the second spacer bar is an additional active region adjacent to and disconnected from the second active region.

11. The integrated circuit structure of claim 10, wherein the first spacer bar, the second spacer bar, the first MOS device, and the second MOS device are within boundaries of a standard cell.

12. The integrated circuit structure of claim 11, wherein each of the first spacer bar and the second spacer bar adjoins three boundaries of the standard cell.

13. The integrated circuit structure of claim 10 further comprising a first shallow trench isolation (STI) region between and adjoining the first active region and the first spacer bar, and a second STI region between and adjoining the second active region and the second spacer bar.

14. The integrated circuit structure of claim 10 further comprising a tap cell comprising a pickup region for a well region, wherein the first active region is in the well region, and wherein the tap cell further comprises a third spacer bar adjoining, and of a same conductivity type as, the first spacer bar.

15. The integrated circuit structure of claim 10 further comprising a filler cell comprising a dummy gate electrode strip and a dummy active region, wherein the filler cell further comprises a third spacer bar adjoining, and of a same conductivity type as, the first spacer bar.

16. An integrated circuit structure comprising:
    a standard cell comprising a first boundary, a second boundary, a third boundary, and a fourth boundary, wherein the first boundary and the second boundary are on opposite ends of the standard cell, and the third boundary and the fourth boundary are on opposite ends of the standard cell, and wherein the standard cell comprises:
    a semiconductor substrate;
    a first active region in the semiconductor substrate;
    a gate electrode strip over the first active region;
    a first spacer bar being an additional active region in the semiconductor substrate, wherein the first spacer bar adjoins an entirety of the third boundary, a portion of the first boundary, and a portion of the second boundary, and wherein the first spacer bar and the first active region are of a first conductivity type; and a first insulation region in the semiconductor substrate, wherein the first insulation region is between and adjoining at least a portion of the first active region and at least a portion of the first spacer bar.

17. The integrated circuit structure of claim 16 further comprising:
a second spacer bar in the semiconductor substrate, wherein the second spacer bar adjoins an entirety of the fourth boundary, a portion of the first boundary, and a portion of the second boundary, and wherein the second spacer bar and a second active region are of a second conductivity type opposite the first conductivity type; and
a second insulation region in the semiconductor substrate, wherein the second insulation region is between and adjoining at least a portion of the second active region and at least a portion of the second spacer bar.

18. The integrated circuit structure of claim 16 further comprising a silicide region over and adjoining the first spacer bar.

19. The integrated circuit structure of claim 16 further comprising a tap cell comprising a second spacer bar adjoining, and forming a straight spacer bar with, the first spacer bar.

20. The integrated circuit structure of claim 16 further comprising a filler cell comprising:
a dummy gate electrode strip;
a dummy active region; and
a second spacer bar adjoining, and forming a straight spacer bar with, the first spacer bar.

21. The integrated circuit structure of claim 16 further comprising:
a second active region in the semiconductor substrate and of a same conductivity type as the first spacer bar and the first active region, wherein the second active region is between and adjoining a portion of the first spacer bar and a portion of the first active region.

* * * * *